(12) United States Patent
Nakanishi et al.

(10) Patent No.: US 7,863,392 B2
(45) Date of Patent: Jan. 4, 2011

(54) CURABLE ORGANOPOLYSILOXANE RESIN COMPOSITION AND OPTICAL PART MOLDED THEREFROM

(75) Inventors: Koji Nakanishi, Chiba (JP); Makoto Yoshitake, Chiba (JP); Takashi Sagawa, Chiba (JP); Kasumi Takeuchi, Chiba (JP); Masashi Murakami, Hiroshima (JP)

(73) Assignee: Dow Corning Toray Company, Ltd., Tokyo (JP)

( * ) Notice: Subject to any disclaimer, the term of this patent is extended or adjusted under 35 U.S.C. 154(b) by 0 days.

(21) Appl. No.: 11/994,092

(22) PCT Filed: Jun. 22, 2006

(86) PCT No.: PCT/JP2006/312949

§ 371 (c)(1),
(2), (4) Date: Dec. 27, 2007

(87) PCT Pub. No.: WO2007/001039

PCT Pub. Date: Jan. 4, 2007

(65) Prior Publication Data

US 2009/0118440 A1    May 7, 2009

(30) Foreign Application Priority Data

Jun. 28, 2005  (JP) ............................. 2005-189044

(51) Int. Cl.
*C08L 83/00* (2006.01)
(52) U.S. Cl. .................. 525/478; 523/107; 528/31; 528/32; 528/33
(58) Field of Classification Search ................ 523/107; 525/478; 528/32, 33
See application file for complete search history.

(56) References Cited

U.S. PATENT DOCUMENTS

| | | | | |
|---|---|---|---|---|
| 5,530,075 A | * | 6/1996 | Morita et al. | 525/431 |
| 6,780,518 B2 | * | 8/2004 | Azechi et al. | 428/451 |
| 2002/0161140 A1 | * | 10/2002 | Yoneda et al. | 526/90 |
| 2004/0116640 A1 | * | 6/2004 | Miyoshi | 528/12 |
| 2007/0112147 A1 | * | 5/2007 | Morita et al. | 525/478 |
| 2008/0058441 A1 | * | 3/2008 | Watanabe et al. | 522/170 |

FOREIGN PATENT DOCUMENTS

| | | | |
|---|---|---|---|
| JP | 11001619 A | | 1/1999 |
| JP | 2003-343622 | * | 10/2003 |
| JP | 2004186168 A | | 7/2004 |
| WO | WO 2005/033207 | * | 4/2005 |
| WO | WO 2005/054371 | * | 6/2005 |
| WO | WO 2005/062368 | * | 7/2005 |

OTHER PUBLICATIONS

English language translation and abstract for JP 11001619, extracted from PAJ, dated Oct. 8, 2008, 33 pages.
English language translation and abstract for JP 2004-186168, extracted from PAJ, dated Oct. 8, 2008, 34 pages.

* cited by examiner

*Primary Examiner*—David Wu
*Assistant Examiner*—Robert Jones, Jr.
(74) *Attorney, Agent, or Firm*—Howard & Howard Attorneys PLLC

(57) ABSTRACT

A curable organopolysiloxane resin composition having a viscosity at 25° C. in the range of 0.001 to 5,000 Pa·s, a total acid number as specified by JIS K 2501 (1992) in the range of 0.0001 to 0.2 mg/g, and light transmittance in a cured state equal to or greater than 80%; an optical part comprised of a cured body of the aforementioned composition. The curable organopolysiloxane resin composition of the invention is characterized by good transparency, low decrease in transmittance when exposed to high temperatures, and excellent adhesion when required.

16 Claims, 1 Drawing Sheet

CURABLE ORGANOPOLYSILOXANE RESIN COMPOSITION AND OPTICAL PART MOLDED THEREFROM

RELATED APPLICATIONS

This application claims priority to and all the advantages of International Patent Application No. PCT/JP2006/312949, filed on Jun. 22, 2006, which claims priority to Japanese Patent Application No. JP2005-189044, filed on Jun. 28, 2005.

TECHNICAL FIELD

The present invention relates to a curable organopolysiloxane resin composition and to an optical part made from a cured body of the aforementioned composition,

BACKGROUND ART

Curable silicone resin compositions are known for their excellent properties, such as resistance to heat and to cold, electrical insulation properties, weatherproof properties, repellency of water, transparency, etc. Due to these properties, the above compositions find wide application in various industries. Since the curable silicone resin compositions are superior to other organic resin materials with regard to their resistance to color change and deterioration of physical properties, one can expect that such compositions will find use as a material for optical parts. For example, Japanese Unexamined Patent Application Publication (hereinafter referred to as "Kokai") H11-1619 discloses an addition-reaction-curable silicone resin composition of an organopolysiloxane resin that contains alkenyl and phenyl groups, an organohydrogenpolysiloxane, and an addition-reaction catalyst; Kokai 2004-186168 (corresponding US Patent Application Publication No. 2004116640A1) discloses an optical silicone resin composition for light-emitting diodes (LEDs) that is composed of an alkenyl-containing silicone resin, an organohydrogenpolysiloxane, and an addition-reaction catalyst.

Until recently, optical components made from the aforementioned silicone resin compositions were considered to be materials with excellent resistance to heat and light. In view of the recent tendency to miniaturization of optical components and the increase in frequencies of light sources, the aforementioned compositions encountered a problem associated with a decrease in reliability of optical parts made from these compositions because of coloration that leads to a decrease in light transmittance.

DISCLOSURE OF INVENTION

On the basis of profound studies conducted by the inventors herein for finding the source of coloration of highly transparent curable organopolysiloxane resin compositions that contain phenyl groups, the inventors have understood the effect of chlorine, acetic acid, or other acidic substances that remain as impurities at different stages of starting-material production and have solved the problem by holding the acidity of the aforementioned curable organopolysiloxane resin compositions at a low level.

It is an object of the present invention to provide a curable organopolysiloxane resin composition that resists yellowing even as a result of heating. It is another object to provide an optical part made of a curable body of the aforementioned composition.

The curable organopolysiloxane resin composition of the invention is characterized by having a viscosity at 25° C. in the range of 0.001 to 5,000 Pa·s, a total acid number as specified by JIS K 2501 (1992) in the range of 0.0001 to 0.2 mg/g, and light transmittance in a cured state equal to or greater than 80%.

The curable organopolysiloxane composition of the present invention comprises:

(A) 100 parts by weight of an organopolysiloxane resin that contains at least an alkenyl group and a phenyl group and is represented by the following average structural formula:

$$R^1_a R^2_b SiO_{(4-a-b)/2} \quad (1)$$

(where $R^1$ is an alkenyl group having 2 to 10 carbon atoms, $R^2$ is an optionally substituted univalent hydrocarbon group (except for an alkenyl group) having 1 to 10 carbon atoms, at least 20 mole % of $R^2$ comprising phenyl groups; subscript "a" is a number in the range of 0.05 to 0.5, and subscript "b" is a number in the range of 0.80 to 1.80);

(B) 10 to 100 parts by weight of an organohydrogenpolysiloxane having in one molecule at least two silicon-bonded hydrogen atoms and represented by the following average structural formula:

$$H_c R^3_d SiO_{(4-c-d)/2} \quad (2)$$

(where $R^3$ is an optionally substituted univalent hydrocarbon group (except for an alkenyl group) having 1 to 10 carbon atoms; subscript "c" is a number in the range of 0.35 to 1.0, and subscript "d" is a number in the range of 0.90 to 2.0); and (C) catalytic quantity of a hydrosilylation-reaction catalyst.

Component (B) of the curable organopolysiloxane resin composition may comprise (B1) an organohydrogenpolysiloxane having in one molecule at least two silicon-bonded hydrogen atoms or a mixture of aforementioned constituent (B1) with (B2) an organohydrogenpolysiloxane having in one molecule three or more silicon-bonded hydrogen atoms.

Furthermore, the aforementioned curable organopolysiloxane resin composition may also comprise (D) 2 to 50 parts by weight of an organooligosiloxane having at least an alkenyl group and a phenyl group and represented by the following average structural formula:

$$R^6_e R^7_f SiO_{(4-e-f)/2} \quad (3)$$

(where $R^6$ is an alkenyl group having 2 to 10 carbon atoms, $R^7$ is an optionally substituted univalent hydrocarbon having 1 to 10 carbon atoms (except for an alkenyl group); at least 10 mole % of $R^7$ being phenyl groups; subscript "e" is a number in the range of 0.40 to 0.80; and subscript "f" is a number in the range of 1.50 to 2.10).

The aforementioned curable organopolysiloxane resin composition may also comprise 0.01 to 20 parts by weight of an epoxy-containing organic silicon compound (E).

The aforementioned component (E) is a compound represented by the following average structural formula:

$$R^8_h R^9_i SiO_{(4-h-i)/2} \quad (4)$$

(where $R^8$ is an epoxy-containing organic group, $R^9$ is an optionally substituted univalent hydrocarbon group that may or may not have an epoxy group and that contains 1 to 10 carbon atoms; 1 mole % or more of all substituents of component E comprising alkenyl groups; subscript "h" is a number in the range of 0.05 to 1.8; and subscript "i" is a number in the range of 0.10 to 1.80).

The optical part of the present invention is characterized by comprising a cured body of the aforementioned curable organopolysiloxane resin composition. An optical part of the present invention may constitute a coating made from the aforementioned organopolysiloxane resin composition on an optical semiconductor device.

Since the curable organopolysiloxane resin composition of the invention has a total acid number, as specified by JIS K 2501 (1992), in the range of 0.0001 to 0.2 mg/g, it does not lose its transparency even after exposure to high temperatures. Furthermore, since the optical part of the invention is comprised of a cured body of curable organopolysiloxane resin of the invention that does not lose its transparency after exposure to high temperatures, it is characterized by excellent reliability.

REFERENCE NUMERALS USED IN THE DESCRIPTION AND DRAWING

Figure 1:
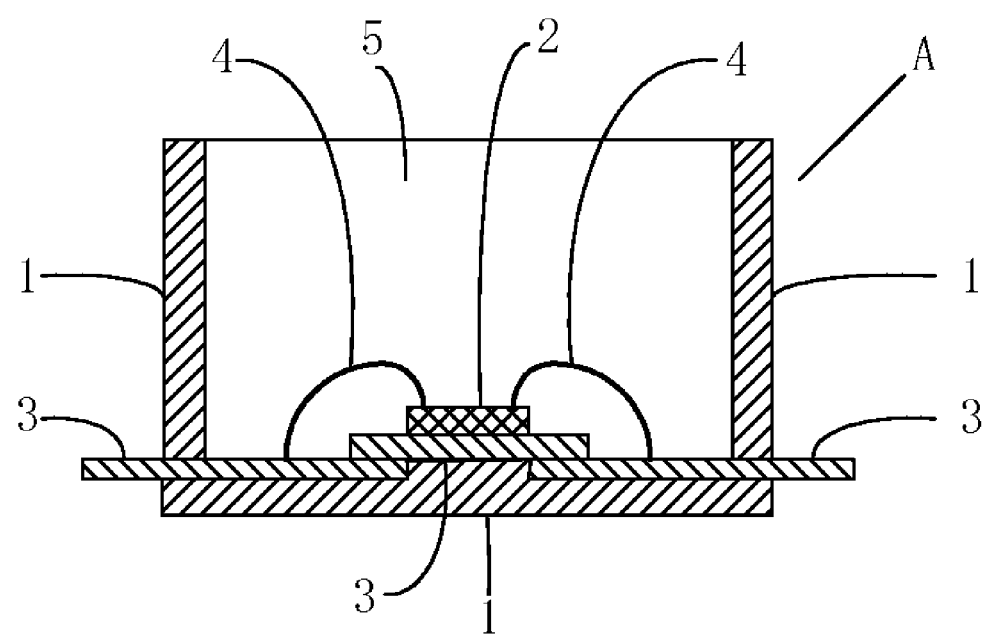
FIG. 1 is a cross-sectional view of a single LED shown as an example of the device of the invention.

A Surface-mounting-type light-emitting diode (LED)
1 Case made from polyphthalamide resin (PPA)
2 LED semiconductor element
3 lead electrode
4 Bonding wire
5 Cured body of the curable organopolysiloxane resin composition

BEST MODE FOR CARRYING OUT THE INVENTION

Let us first consider a curable organopolysiloxane resin composition which prior to curing is in a liquid state and has a total acid number, as specified by JIS K 2501 (1992), in the range of 0.0001 to 0.2 mg/g.

The curable organopolysiloxane resin composition of the present invention has a viscosity of 0.001 to 5,000 Pa·s, preferably 0.01 to 1,000 Pa·s, at 25° C., and even more preferably, 1 to 1,000 Pa·s. If the viscosity of the curable organopolysiloxane resin composition at 25° C. is in the aforementioned range, the composition will be obtained with flowability suitable for various molding processes.

The curable organopolysiloxane resin composition of the present invention has a total acid number, as specified by JIS K 2501 (1992), in the range of 0.0001 to 0.2 mg/g., preferably 0.0001 to 0.040 mg/g. If the total acid number exceeds the recommended upper limit, a cured body obtained by curing the curable organopolysiloxane resin composition of the invention will acquire a color when subjected to heating, and its light-transmitting properties will degrade. More specifically, in order to minimize the decrease of light transmission in the short-wavelength band through a cured body that has been subjected to heating, it is most preferable to provide the aforementioned total acid number in the range of 0.0001 to 0.010 mg/g.

A cured body obtained by curing a curable organopolysiloxane resin composition of the invention is optically transparent, and its light transmission should exceed 80%, preferably 90%, and even more preferably, 95%. Such light transmittance allows transmission of visible light of a 555 nm-wavelength through a 1 mm-thick cured body obtained by curing the aforementioned curable organopolysiloxane resin composition of the present invention. The wavelength of 555 nm is near the median-value wavelength of visible light, which is known as a wavelength that can be perceived most sensitively by the human eye.

Furthermore, a cured body obtained by curing the organopolysiloxane resin composition of the invention provides the highest transmission of light in the short-wavelength band. It is recommended that in the initial state, i.e., before heat treatment such as heating during an accelerated deterioration test, transmission of 400 nm-wavelength light through a 1 mm-thick cured body of the curable organopolysiloxane resin composition should exceed 80%, preferably 90%, and even more preferably, 95%. Normally, when an optical part that contains an organic substance is exposed to a high temperature, in most cases it gradually yellows and becomes colored. It is understood that transmission of light in a short-wavelength range, such as blue to violet, is characterized by a much greater loss in light transmission than that of other visible-light wavelengths. Therefore, it is possible to evaluate the degree of coloration of an optical part by comparing light transmission of short wavelengths, e.g., by measuring transmittance of 400 nm light through the aforementioned optical part. The degree to which coloration of the optical part is allowed depends on the specific application. For example, it may be preferable that after aging for 14 days at 200° C., transmittance of a 400 nm-wavelength light exceed 40%, preferably 50%.

The curable organopolysiloxane resin composition of the present invention can be molded by using various processes, and since a cured body thereof is optically transparent, the obtained cured body can be used as an optical part.

The curable organopolysiloxane resin composition of the present invention may comprise the components described below.

An organopolysiloxane composition (A) that contains at least an alkenyl group and a phenyl group and is represented by the following average structural formula:

$$R^1_a R^2_b SiO_{(4-a-b)/2} \quad (1)$$

is a main component of the curable organopolysiloxane resin composition of the present invention. Under the catalytic action of the below-described component (C), the alkenyl groups of component (A) interact through an addition reaction with the silicon-bonded hydrogen atoms of the below-described component (B). In the above formula, $R^1$ is an alkenyl group having 2 to 10 carbon atoms. Examples of such a group are the following: vinyl, allyl, butenyl, hexenyl, or a decenyl group. The vinyl group is most preferable from the point of view of an addition reaction and processing of the aforementioned organopolysiloxane resin. In the above formula, $R^2$ is an optionally substituted univalent hydrocarbon group (except for an alkenyl group) having 1 to 10 carbon atoms. Examples of such groups are the following: methyl, ethyl, propyl, cyclohexyl, or similar alkyl groups; phenyl, tolyl, naphthyl, or similar aryl groups; 3-chloropropyl, 3,3,3-trifluoropropyl, 2-(nonafluorobutyl) ethyl, or similar haloalkyl groups; ethylbenzyl, 1-phenethyl, or similar aralkyl groups. Most preferable of these are alkyl and/or aryl groups, especially phenyl and methyl groups. It is recommended that at least 20 mole %, preferably more than 30 mole %, and even more preferably, more than 40 mole % of $R^2$ in the molecule of the aforementioned component (A) are phenyl groups. It is further preferable that the remaining groups be alkyl and, especially, methyl groups. This is preferable in order to provide improved transparency and physical strength of a cured body obtained from the curable organopolysiloxane resin composition of the present invention.

In the above formula, subscript "a" is an average number of alkenyl groups per one silicon atom of component (A). It is recommended that subscript "a" be in the range of 0.05 to 0.5, preferably 0.05 to 0.30, and even more preferably, 0.09 to 0.18. In the above formula, subscript "b" is an average number of univalent, optionally substituted $C_1$ to $C_{10}$ hydrocarbon groups, other than alkenyl groups, per one silicon atom of component (A). It is recommended that subscript "b" be in the range of 0.80 to 1.80, preferably 1.00 to 1.80, and even more preferably, 1.10 to 1.50. Beyond these ranges, it would be difficult to obtain a curable body of the organopolysiloxane resin composition of the present invention with desired characteristics.

It is recommended that component (A) has a polystyrene-referenced weight-average molecular weight (measured by gel-permeation chromatography) higher than 2,000, This is preferable in order to impart high hardness to a cured body of the organopolysiloxane resin composition. At 25° C., component (A) may be a solid or may constitute a viscous liquid. In a liquid state, it normally has a viscosity of no less than 10 Pa·s at 25° C. This component normally has a branched, net-like, or three-dimensional molecular structure.

Component (A) is normally obtained by hydrolyzing a chlorosilane or by hydrolyzing an alkoxysilane in the presence of an acidic catalyst or a basic catalyst. In each case, an acidic substance is either formed or used. Removal of the aforementioned acidic substance to a sufficient degree makes it possible to lower the total acid number of the obtained curable organopolysiloxane resin composition of the invention and thus to inhibit thermal discoloration of the cured body. It is recommended that the total acid number of component (A), as specified by JIS K2501 (1992), be in the range of 0.0001 to 0.100 mg/g, preferably 0.0001 to 0.050 mg/g, and most preferably 0.0001 to 0.010 mg/g.

One specific method preferable for removal of an acidic substance consists of treating component (A), obtained in the production thereof by hydrolyzing a chlorosilane, with a strong base. This method is preferred because conducting hydrolyzation only with water will leave a large amount of silicon-bonded chlorine atoms. Furthermore, the strong base can be neutralized by using volatile acidic substances. This is advantageous because excessive volatile acidic substances can be easily removed by distillation. The generated salts can be eluted with water. When component (A) is produced by hydrolysis of alkoxy silanes based on the use of acidic substances that possess catalytic properties, such as acetic acids, sulfonic acids, or the like, it is recommended that the acidic catalysts used in the above process should be sufficiently removed by elution with water. In some cases, the total acid number of component (A) may still be high because the aforementioned acidic substances can easily dissolve in an organic layer and may maintain the total acid number of component (A) at a high level.

The aforementioned component (A) may be composed of the following siloxane units:

$ViMe_2SiO_{1/2}$; $ViMePhSiO_{1/2}$; $Me_3SiO$; $Me_2SiO_{2/2}$; $ViMeSiO_{2/2}$; $PhMeSiO_{2/2}$; $PhSiO_{3/2}$; $MeSiO_{3/2}$; $ViSiO_{3/2}$; and $SiO_{4/2}$. In the above formulas, Me designates a methyl group, Vi designates a vinyl group, and Ph designates a phenyl group. The same designations are used hereinafter.

Given below are specific examples of organopolysiloxane resins composed of appropriate siloxane units shown in the form of average structural formulas that contain at least alkenyl and phenyl groups; the following siloxane units also show mole numbers of each siloxane unit per mole number of all siloxane units that constitute one molecule.

$(ViMe_2SiO_{1/2})_{0.25}$ $(PhSiO_{3/2})_{0.75}$, $Vi_{0.25}Me_{0.50}Ph_{0.75}SiO_{0.25}$ a=0.25, b=1.25, Ph/$R^2$ (mole %)=50, $M_w$=2300;

$(ViMe_2SiO_{1/2})_{0.10}$ $(PhSiO_{3/2})_{0.90}$, $Vi_{0.10}Me_{0.20}Ph_{0.90}SiO_{0.4}$ a=0.10, b=1.10, Ph/$R^2$ (mole %)=82, $M_w$=4300;

$(ViMe_2SiO_{1/2})_{0.14}$ $(PhSiO_{3/2})_{0.86}$, $Vi_{0.14}Me_{0.28}Ph_{0.86}SiO_{1.34}$ a=0.14, b=1.14, Ph/$R^2$ (mole %)=75, $M_w$=3200;

$(ViMe_2SiO_{2/2})_{0.10}$ $(PhSiO_{3/2})_{0.90}$, $Vi_{0.10}Me_{0.10}Ph_{0.90}SiO_{1.45}$ a=0.10, b=1.00, Ph/$R^2$ (mole %)=90, $M_w$=8700;

$(ViMe_2SiO_{2/2})_{0.10}$ $(Me_2SiO_{2/2})_{0.15}$ $(PhSiO_{3/2})_{0.75}$, $Vi_{0.10}Me_{0.40}Ph_{0.75}SiO_{1.375}$ a=0.10, b=1.15, Ph/$R^2$ (mole %)=65, $M_w$=7200;

$(ViMe_2SiO_{1/2})_{0.15}$ $(PhSiO_{3/2})_{0.75}$, $(SiO_{4/2})_{0.10}$, $Vi_{0.15}Me_{0.30}Ph_{0.75}SiO_{1.40}$ a=0.15, b=1.05, Ph/$R^2$ (mole %)=62.5, $M_w$=6500.

$R^2$ is the total mole quantity of Me and Ph; $M_w$ is a polystyrene-referenced weight-average molecular weight determined by gel permeation chromatography.

The organohydrogenpolysiloxane represented by average structural formula (2) of component (B) and having two or more silicon-bonded hydrogen atoms in one molecule reacts in an addition reaction with the silicon-bonded alkenyl groups of component (A), i.e., causes cross-linking of component (A) by hydrosilylation. Furthermore, the aforementioned silicon-bonded hydrogen atoms are added by means of an addition reaction to alkenyl groups of component (D). In the following average structural formula:

$$H_c R^3_d SiO_{(4-c-d)/2} \qquad (2),$$

H is a hydrogen atom, and $R^3$ is an optionally substituted univalent $C_1$ to $C_{10}$ hydrocarbon group other than an alkenyl group. $R^3$ can be exemplified by the same groups as aforementioned group $R^2$. Inclusion of phenyl groups is not an indispensable condition for $R^3$, but when component (B) has a relatively low weight-average molecular weight, even though $R^3$ is compatible with component (A), with the lapse of time the absence of phenyl groups may either cause a microphase separation or volatility, and this, in turn, may result in problems, such as roughening of the molded product surfaces, or evaporation of component (B) when curing conditions are exposed to air. Subscript "c" shows the number of silicon-bonded hydrogen atoms in component (B) which is in the range of 0.35 to 1.0; subscript "d" shows the average number of $C_1$-$C_{10}$ optionally substituted univalent hydrocarbon groups other than an alkenyl group of component (B) per one silicon atom of component (B). The last-mentioned number is in the range of 0.90 to 2.0. At 25° C. component (B) can be in a solid or in a liquid state, but the liquid state is preferable because it facilitates preparation of the composition. Viscosity at 25° C. should be below 100 Pa·s, preferably in the range of 1 to 1,000 mPa·s. Component (B) may have a linear, cyclic, branched, net-like, or three-dimensional molecular structure. Two or more different types of component (B) can be used in combination.

Component (B) is obtained, e.g., by hydrolyzing a chlorosilane or by hydrolyzing an alkoxysilane in the presence of an acidic catalyst. In both cases, however, acidic substances are either generated or used. By removing the aforementioned acidic substances to a sufficient degree, it becomes possible to lower the total acid number of the obtained curable organopolysiloxane resin composition and to restrict discoloration during heating of a cured body obtained from the composition. It is desirable that component (B) obtained by the aforementioned methods have a total acid number according to JIS K2501 (1992) in the range of 0.0001 to 1,000 mg/g, preferably 0.0001 to 0.200 mg/g, and even more preferably, 0.0001 to 0.050 mg/g. Inhibition of thermal discoloration shown in the examples of the curable silicone compositions of present patent applications results from restriction of the acid number in the obtained compositions.

Specific methods for removing an acidic substance may comprise filtering after neutralization with basic groups; absorbing the acidic substances by means of an absorption agent such as a powdered active carbon, magnesium hydroxide, magnesium carbonate, magnesium oxide, magnesium silicate, aluminum oxide, aluminum silicate, etc., with subsequent filtering and washing with water. Among the above methods, most preferable is washing by water or washing in combination with absorption agents because, in general, basic conditions facilitate the hydrolysis of silicon-bonded hydrogen atoms of component (B). The effect of removal of acidic substances by washing is improved either by extending the washing time, or by increasing the number of washing cycles. If component (B) has a low molecular weight and can be subjected to distillation, in some cases, the acidic substances can be separated because of the differences in boiling points.

The aforementioned component (B) can be exemplified by methylhydrogenpolysiloxanes and methylphenylhydrogenpolysiloxanes represented by siloxane units and the average structural formulae given below:

$(HMe_2SiO_2)_{0.65}$ $(PhSiO_{3/2})_{0.35}$, $H_{0.65}Me_{1.30}Ph_{0.35}SiO_{0.85}$ c=0.65, d=1.65, Ph/R$^3$ (mole %)=21;

$(HMe_2SiO_{1/2})_{0.60}$ $(PhSiO_{3/2})_{0.40}$, $H_{0.60}Me_{1.2}Ph_{0.40}SiO_{0.90}$ c=0.60, d=1.60, Ph/R$^3$ (mole %)=25;

$(HMe_2SiO_{1/2})_{0.40}$ $(PhSiO_{3/2})_{0.60}$, $H_{0.40}Me_{0.80}Ph_{0.60}SiO_{1.10}$ c=0.40, d=1.40, Ph/R$^3$ (mole %)=43;

$(HMe_2SiO_{1/2})_{0.35}$ $(PhSiO_{3/2})_{0.65}$, $H_{0.35}Me_{0.70}Ph_{0.65}SiO_{1.15}$ c=0.35, d=1.05, Ph/R$^3$ (mole %)=48;

$(HMe_2SiO_{2/2})_{0.65}$ $(PhSiO_{3/2})_{0.35}$, $H_{0.65}Me_{0.65}Ph_{0.35}SiO_{1.75}$ c=0.65, d=1.00, Ph/R$^3$ (mole %)=35;

$(HMeSiO_{2/2})_{0.50}$ $(PhSiO_{3/2})_{0.50}$, $H_{0.5}Me_{0.50}Ph_{0.50}SiO_{1.25}$ c=0.50, d=1.00, Ph/R$^3$ (mole %)=50;

$(HMe_2SiO_{2/2})_{0.35}$ $(PhSiO_{3/2})_{0.65}$, $H_{0.35}Me_{0.35}Ph_{0.65}SiO_{1.325}$ c=0.35, d=1.00, Ph/R$^3$ (mole %)=65;

$(HMe_2SiO_{1/2})_{0.60}$ $(PhSiO_{3/2})_{0.40}$, $H_{0.65}Me_{0.60}Ph_{1.00}SiO_{0.90}$ c=0.60, d=1.60, Ph/R$^3$ (mole %)=63;

$(HMe_2SiO_{1/2})_{0.40}$ $(PhSiO_{3/2})_{0.60}$, $H_{0.4}Me_{0.40}Ph_{1.00}SiO_{1.10}$ c=0.40, d=1.40, Ph/R$^3$ (mole %)=71;

$(HMe_2SiO_{1/2})_{0.66}$ $(Ph_2SiO_{2/2})_{0.33}$, $H_{0.66}Me_{1.32}Ph_{0.66}SiO_{0.66}$ c=0.66, d=1.15, Ph/R$^3$ (mole %)=33;

$(HMe_2SiO_{1/2})_{0.75}$ $(PhSiO_{3/2})_{0.25}$, $H_{0.75}Me_{1.50}Ph_{0.25}SiO_{0.75}$ c=0.66, d=1.15, Ph/R$^3$ (mole %)=14.

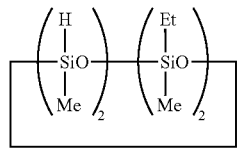

In the above formulae, Et designates an ethyl group, and R$^3$ designates the total mole quantity of Me and Ph.

Component (B) is added in an amount of 10 to 100 parts by weight per 100 parts by weight of component (A). From the point of view of improved curing properties and physical characteristics of a cured body, it is recommended that the amount of silicon-bonded hydrogen atoms in component (B) per one alkenyl group of component (A) be in the range of 0.5 to 3 moles, preferably 0.7 to 1.5 moles.

Because the curable organopolysiloxane resin composition (B) of the invention that contains constituent (B1) in the form of an organohydrogenpolysiloxane represented by average structural formula (2) and having in one molecule two silicon-bonded hydrogen atoms provides improved adhesion to various substrates during curing, such a composition can be used in the manufacture of optical semiconductor devices as a cured coating for various optical semiconductor parts. It is also possible to use component (B) as a combination of the aforementioned organohydrogenpolysiloxane of constituent (B1) with constituent (B2) which is an organohydrogenpolysiloxane having in one molecule three or more silicon-bonded hydrogen atoms. The aforementioned combination of constituents (B1) and (B2) can be used when it is necessary to obtain a cured body having a higher hardness because the joint use of these constituents makes it possible to obtain a cured body of the curable organopolysiloxane resin composition of the invention with a hardness higher than when component (B) consists of only constituent (B1). A ratio of constituent (B1) to (B2) is in the range (100:0) to (10:90), preferably (100:0) to (50:50), and even more preferably (100:0) to (70:30).

Hydrosilylation catalyst (C) is a catalyst for a reaction of an addition of vinyl groups contained in component (A) to silicon-bonded hydrogen atoms contained in component (B), i.e., for a hydrosilylation reaction. Specific examples of such a catalyst are the following: fine platinum powder, platinum black, chloroplatinic acid, platinum tetrachloride, alcohol-modified chloroplatinic acid, platinum-olefin complex, platinum-alkenylsiloxane complex, platinum-carbonyl complex; methylmethacrylate resin, polycarbonate resin, polystyrene resin, siloxane resin, or similar thermoplastic organic resins in a powdered form that contain the aforementioned platinum-type catalysts; rhodium-type catalysts represented by the following formulae: $[Rh(O_2CCH_3)_2]_2$, $Rh(O_2CCH_3)_3$, $Rh_2(C_8H_{15}O_2)_4$, $Rh(C_5H_7O_2)_3$, $Rh(C_5H_7O_2)(CO)_2$, $Rh(CO)[Ph_3P](C_5H_7O_2)$, $RhX_3[(R^4)_2S]_3$, $(R^5{}_3P)_2Rh(CO)X$, $(R^5{}_3P)_2Rh(CO)H$, $Rh_2X_2Y_4$, $Rh[O(CO)R^4]_{3-n}(OH)_n$, and $H_mRh_p(En)_qCl_r$ (where X represents a hydrogen atom, chlorine atom, bromine atom, or an iodine atom; Y represents a methyl group, ethyl group, or a similar alkyl group, CO, $C_8H_{14}$, or $0.5C_8H_{12}$; R$^4$ represents an alkyl group, cycloalkyl group, or an aryl group; R$^5$ represents an alkyl group, aryl group, alkyloxy group, or an aryloxy group; En represents an olefin; "n" is 0 or 1; "m" is 0 or 1; "p" is 1 or 2; "q" is an integer from 1 to 4; and "r" is 2, 3, or 4); or an iridium-type catalyst represented by the following formulae: $Ir(OOCCH_3)_3$, $Ir(C_5H_7O_2)_3$, $[Ir(Z)(En)_2]_2$, or $[Ir(Z)(diene)]_2$ (where Z represents for a chlorine atom, bromine atom, iodine atom, or an alkoxy group; En represents for an olefin; and diene represents for cyclooctadiene). Most preferable of the above examples are platinum-type catalysts.

In particular, it is preferable to use a platinum-alkenylsiloxane complex having a low concentration of chlorine. Examples of the aforementioned alkenylsiloxane are the following: 1,3-divinyl-1,1,3,3-tetramethylsiloxane, 1,3,5,7-tetramethyl-1,3,5,7-tetravinylcyclotetrasiloxane, and alkenylsiloxane wherein a part of their methyl groups is substituted with ethyl groups, phenyl groups, etc., or alkenylsiloxanes wherein vinyl groups are substituted with allyl groups, hexenyl groups, or the like. Due to the high stability of platinum-alkenylsiloxane complexes, it is recommended to use 1,3-divinyl-1,3,3-tetramethyldisiloxane. Furthermore, in order to further improve the stability of platinum-alkenylsiloxane complexes, they can be combined with 1,3-divinyl-1,3,3-tetramethyldisiloxane, 1,3-diallyl-1,1,3,3-tetramethyldisiloxane, 1,3-divinyl-1,3-dimethyl-1,3-diphenyldisoloxane, 1,3-divinyl-1,1,3,3-tetraphenyldisiloxane, 1,3,5,7-tetramethyl-1,3,5,7-tetravinylcyclotetrasiloxane, or similar alkenylsiloxanes or methylsiloxane oligomers such as organosiloxane oligomers, especially alkenyl oligomers.

Hydrosilylation-reaction catalyst (C) is used in a so-called catalytic quantity, which in terms of a metal component per total weight of the curable organopolysiloxane composition of the invention, is in the range of 1 to 500 ppm, preferably 2 to 100 ppm. In order to provide the aforementioned catalytic quantity, the total acid number in the final curable organopolysiloxane composition, as specified by JIS K2501 (1992) with regard to the hydrosilylation-reaction catalyst, should be in the range of 0.0001 to 0.2 mg/g, preferably 0.0001 to 100 mg/g, and even more preferably, 0.0001 to 10 mg/g.

The curable organopolysiloxane resin composition of the invention composed of components (A) through (C) can be combined with component (D), which is comprised of an organooligosiloxane containing at least an alkenyl group and a phenyl group. Component (D) is represented by average structural formula (3) and is added as a reactive diluent component, to decrease the viscosity of the curable organopolysiloxane resin of the invention as well as to improve its moldability and flowability and to adjust physical properties of a cured body obtained from the composition.

$$R^6_e R^7_f SiO_{(4-e-f)/2} \quad (3)$$

In this formula, $R^6$ designates a $C_2$ to $C_{10}$ alkenyl group, vinyl group, allyl group, butenyl group, hexenyl group, or a decenyl group. From the point of view of the addition reaction and in order to facilitate treatment of the aforementioned organopolysiloxane resin, most preferable are vinyl groups. In the above formula, $R^7$ is an optionally substituted $C_1$ to $C_{10}$ univalent hydrocarbon other than an alkenyl group; and $R^7$ can be exemplified by the same groups as aforementioned group $R^2$. At least 10 mole % of all $R^7$s in one molecule are phenyl groups, the remaining being alkyl groups. Preferably, groups $R^7$ are only phenyl groups or phenyl groups in combination with methyl groups. This is preferable to provide improved compatibility between components (A) and (B) and to improve resistance to heat and transparency in a cured body. Subscript "e" designates an average number of alkenyl groups per one silicon atom of component (D); it is recommended to have subscript "e" in the range of 0.40 to 0.80, preferably 0.60 to 0.80. Subscript "f" designates an average number of optionally substituted univalent hydrocarbon groups other than alkenyl groups per one silicone atom of component (D). It is recommended that subscript "f" be in the range of 1.50 to 2.10, preferably 1.50 to 2.00.

In order to convert component (A), which is solid at room temperature, into a liquid by dissolving it, or to reduce viscosity of component (A) when it is a highly viscous liquid, component (D) should be liquid at room temperature, and it is recommended that its viscosity at 25° C. be equal to or less than 10 Pa·s, preferably from 1 mPa·s to 100 mPa·s. It is recommended that the total acid number, as specified by JIS K2501 (1992), be in the range of 0.0001 to 0.2 mg/g, preferably 0.0001 to 0.04 mg/g.

An example of a preferable component (D) is an alkenyl-functional organooligosiloxane of formula $(R^6R^7_2SiO)_g SiR^7_{(4-g)}$, where $R^6$ and $R^7$ are the same as defined above, and "g" is 2 or 3.

Specific examples of component (D) are given below in the form of methylphenylvinyloligosiloxanes represented by siloxane unit formulae and average structural formulae shown below.

$(ViMe_2SiO)_3SiPh$, $Vi_{0.75}Me_{1.50}Ph_{0.25}SiO_{0.75}$; c=0.75, d=1.75, $Ph/R^7$ (mole %)=14;

$(ViMe_2SiO)_2SiPh_2$, $Vi_{0.67}Me_{1.33}Ph_{0.67}SiO_{0.67}$; c=0.67, d=2.00, $Ph/R^7$ (mole %)=33;

$(ViMe_2SiO)_3SiPh$, $Vi_{0.75}Me_{0.75}Ph_{1.00}SiO_{0.75}$; c=0.75, d=1.75, $Ph/R^7$ (mole %)=57;

$(ViMe_2SiO)_2SiPh_2$, $Vi_{0.67}Me_{0.67}Ph_{1.33}SiO_{0.67}$; c=0.67, d=2.00 $Ph/R^7$ (mole %)=67;

$(ViMe_2SiO)_2SiMePh$, $Vi_{0.67}Me_{1.67}Ph_{0.33}SiO_{0.67}$; c=0.67, d=2.00 $Ph/R^7$ (mole %)=17.

$R^7$ designates a total mole quantity of Me and Ph. Two or more components (D) of different types can be used in combination.

If necessary, the curable silicone composition of the present invention prepared from components (A) through (C) or (A) through (D) may be further combined with component (E), which is an epoxy-containing silicon compound. The aforementioned epoxy-containing silicon compound (E) imparts to the curable silicone composition of the invention improved adhesion to various substrates. There are no special restrictions with regard to the total acid number of component (E), as specified by JIS K2501 (1992), but it is recommended that this number be in the range of 0.0001 to 0.2 mg/g. Examples of such epoxy-containing organic silicon compounds are the following:

glicydoxypropyltrimethoxysilane, glicydoxypropyltriethoxysilane, glicydoxypropylmethyldimethoxysilane, epoxycyclohexylethyltrimethoxysilane, epoxycyclohexylethyltriethoxysilane, or similar epoxy-containing silane compounds; a product of condensation of glicydoxypropyltrialkoxysilane and dimethylpolysiloxane capped at molecular terminals with silanol groups; a product of condensation of glicydoxypropyltrialkoxysilane and methylvinylpolysiloxane capped at molecular terminals with silanol groups; a product of condensation of glicydoxypropyltrialkoxysilane and a copolymer of methylvinylsiloxane and phenylmethylsiloxane capped at molecular terminals with silanol groups; or similar products of condensation of epoxy-containing silane compounds and diorganopolysiloxanes.

Among the compounds listed above, especially preferable from the point of view of excellent adhesion to various substrates, are organopolysiloxanes represented by average structural formula (4) given below, which contain epoxy groups and alkenyl groups.

$$R^8_h R^9_i SiO_{(4-h-i)/2} \quad (4)$$

In the above formula, $R^8$ designates an epoxy-containing organic group such as a glicydoxypropyl group, epoxycyclohexylethyl group, or a similar epoxy-containing alkyl group; $R^9$ designates an optionally substituted $C_1$ to $C_{10}$ univalent hydrocarbon group, which is free of an epoxy group; more than 1 mole %, preferably more than 3 mole %, and even more preferably, more than 10 mole % of $R^9$s are alkenyl groups. From the point of view of improved compatibility with the curable organopolysiloxane resin composition of the invention, it is recommended that phenyl groups of $R^9$ constitute at least 3 mole %, preferably 10 mole % of all substituents; subscript "h" is in the range of 0.05 to 1.8, preferably 0.05 to 0.7, and, even more preferably, 0.1 to 0.6; subscript "i" is in the range of 0.10 to 1.80, preferably in the range of 0.20 to 1.80; it is recommended that subscripts "h" and "i" together satisfy the following condition: (h+i≧2). The aforementioned organopolysiloxanes that contain epoxy and alkenyl groups can be easily obtained by cohydrolyzing epoxy-containing alkoxysilanes and alkenyl-containing alkoxysilanes. The epoxy-containing organopolysiloxanes may contain a small amount of alkoxy groups derived from their raw materials.

The following compounds are examples of the organopolysiloxanes of average structural formula (4) that contain epoxy groups and alkenyl groups:

$(ViMe_2SiO_{1/2})_{25}(PhSiO_{3/2})_{75}(EpMeSiO_{2/2})_{40}$; $[Vi_{0.18} Me_{0.64} Ep_{0.29} Ph_{0.54}SiO_{1.18}]$; $(ViMe_2SiO_{1/2})_{50}(PhSiO_{3/2})_{50}(EpMeSiO_{2/2})_{60}$; $[Vi_{0.31} Me_{1.00} Ep_{0.38} Ph_{0.31}SiO_{1.00}]$; $(ViMe_2SiO_{1/2})_{25}(PhSiO_{3/2})_{75}(EpSiO_{3/2})_{40}$; $[Vi_{0.18} Me_{0.36} Ep_{0.29} Ph_{0.54}SiO_{1.32}]$; $(ViMe_2SiO_{1/2})_{25}(PhSiO_{3/2})_{75}(EpSiO_{3/2})_{40}(OMe)_{50}$; and $[Vi_{0.18} Me_{0.36} Ep_{0.29} Ph_{0.54}SiO_{1.32}(OMe)_{0.36}]$, where Ep designates glicydoxypropyl groups.

The epoxy-containing organic silicon compounds are used in an amount of 0.01 to 20 parts by weight, preferably 0.1 to 8 parts by weight, per 100 parts by weight of the curable organopolysiloxane resin composition of the invention. If the aforementioned compounds are used in an amount exceeding the recommended upper limit, this will either reduce weatherproofing properties of the cured body or will change the color of this body after heat treatment.

In order to inhibit curing at room temperature and to extend the pot life, the curable silicone composition of the invention prepared by compounding components (A) through (C), components (A) through (D), components (A) through (E), or by compounding components (A), (B), (C), and (E) can be further combined with a hydrosilylation-reaction retardant. Furthermore, if necessary, and if it is not detrimental to the effects of the invention, the composition may also incorporate fumed silica, quartz powder, or a similar finely powdered silica, titanium oxide, zinc oxide, or a similar inorganic filler of a dye, as well as flame retardants, heat-resistant agents, oxidation inhibitors, or the like.

When the composition of the invention is used as a protective agent for semiconductor parts of light-emitting diodes (LED), it may contain luminescent substances such as compounds of an yttrium-aluminum-garnet system (YAG). There are no restrictions with regard to the amount in which such luminescent substances can be added, but it can be recommended to add them in an amount of 1 to 20 wt. %, preferably 5 to 15 wt. % of the composition. Furthermore, in the limits not contradictory to the object of the present invention, the composition may incorporate other arbitrary additives, such as silica, glass, alumina, zinc oxide, or similar inorganic fillers; polymethacrylate resin, or similar finely powdered organic resins; heat resistant agent, dye, pigment, flame retardant, solvent, or the like.

The addition-reaction-curable organopolysiloxane resin composition of the invention is easily prepared by mixing components (A) through (C), components (A) through (D), components (A) through (E), or components (A), (B), (C), and (E), if necessary, with the aforementioned arbitrary additives. Since mixing components (A) through (C) may initiate a curing reaction even at room temperature, their pot life can be extended by adding to the mixture a hydrosilylation reaction retardant. Alternatively, a mixture of components (A) and (B), if necessary, with component (D) and/or component (E) without component (C), and a mixture of at least component (A) and component (C), if necessary, with component (D) and/or component (E) without component (B) can be stored separately and then can be uniformly mixed together directly prior to use.

The curable organopolysiloxane resin composition of the invention can be cured by retaining it intact at room temperature, or the curing can be accelerated by heating, or it can be injected molded, compression molded, molded by casting, or cured into an appropriate form such as a coating. The aforementioned curable organopolysiloxane resin composition can be cured alone, cured for adhesion to another part, or cured for forming an integral body with another substrate.

When it is necessary to form an integral body with another substrate, component (B) of the curable organopolysiloxane resin composition may be composed of constituents (B1) and (B2), or the aforementioned curable organopolysiloxane resin composition may be combined with epoxy-containing organic silicon compound (E). However, for more efficient bonding by curing to another substrate, it is preferable to use constituents (B1) and (B2) together with compound (E). The aforementioned substrate may be comprised of polyphthalamide (PPA), polyamide resin, polyester resin, bis-maleimide-triazine resin (BT), or similar engineering plastics; iron, aluminum, silver, copper, stainless steel, gold, or similar metals.

When the curable organopolysiloxane resin composition of the invention is cured by heating, the curing temperature is normally in the range of 100° C. to 200° C., and the curing time is 30 min. to 1 sec. In order to remove volatile components that after curing may be contained in an amount from small to microscopic, it is recommended to subject the product to post-curing for 10 min. to 2 hours at a temperature of 150° C. to 250° C.

Optical parts of the present invention may comprise parts permeable to visible light, infrared light, ultraviolet rays, far-ultraviolet rays, X-rays, laser rays, or similar rays that are capable of curing the aforementioned curable organopolysiloxane resin composition. The optical parts of the present invention may be exemplified by optical lenses, prisms, light-transmission plates, light-deflecting plates, light guides, sheets, films, or similar light-beam formed article; molding agents, sealing agents, casting agents, coating agents, adhesives, protective agents for semiconductor elements of optical semiconductor devices or for similar applications other than formed article. Furthermore, the optical parts of the invention may be represented by those exposed to temperatures higher than room temperature, e.g., 50 to 200° C., or by optical parts that operate in direct contact or close to high-intensity light sources.

Good examples of optical parts of the invention are those used as optical semiconductor devices. Such devices may be characterized by having semiconductor elements that are directly or indirectly coated with a cured body of the aforementioned curable organopolysiloxane resin composition. Examples of such optical semiconductor elements are photo diodes, photo transistors, photo darlington, CdS cells, photo conductors, photo thyristors, photo triacs, photoelectronic elements, photoelectronic sensors, or similar light-receiving elements; and light-emitting diodes (LEDs) or similar light-emitting elements. Examples of optical semiconductor devices are light-emitting diodes (LEDs); photo isolators, photo interrupters, or similar photo couplers; photo relays, photo ICs; complementary metal oxide semiconductors (CMOS), charge-coupled devices, or similar solid-state imaging elements. Of those mentioned above, light-emitting diodes (LEDs) are the most typical examples.

FIG. 1 is a cross-sectional view of a single LED shown as an example of the device of the invention. The LED in FIG. 1 comprises an LED semiconductor element 2 which is die-bonded to a lead electrode 3. The aforementioned semiconductor element 2 and a lead electrode 3 are wire-bonded by means of bonding wires 4. Such semiconductor element 2 is coated by a cured body 5 of the curable organopolysiloxane resin composition of the invention that contains 5 to 15 wt. % of a light-emitting substance (YAG).

For manufacturing the LED shown in FIG. 1, the LED semiconductor element 2 is die-bonded to the lead electrode 3, and the semiconductor element 2 is wire-bonded to the lead electrode 3 by gold bonding wires 4. In the next stage, the curable organopolysiloxane resin composition of the invention that contains 5 to 15 wt. % of the luminescent substance (YAG) is applied to the semiconductor element 2, and then the composition is cured by heating at 50 to 200° C.

APPLICATION EXAMPLES

The present invention will be further described in more detail with reference to application examples of the curable organopolysiloxane resin composition and of the semiconductor device of the invention. In the examples given below, the values of viscosity were obtained at 25° C. The following characteristics of the curable organopolysiloxane resin composition and cured bodies thereof were measured.

[Total Acid Number]
The total acid number was measured by the indicator titration method according to JIS K2501 (1992).

[Hardness of Cured Body]
A cured body was produced by curing the curable organopolysiloxane resin composition for 1 hour at 150° C. in a hot-air-circulation-type oven. Hardness of the obtained cured body was measured by the Type-D Durometer according to JIS K6253.

[Refractive Index of the Cured Organopolysiloxane Composition and Cured Body]
The 25° C. refractive index of the curable organopolysiloxane resin composition was measured by an ABBE-type refractometer. The light source used for measurement was visible light with a wavelength of 589 nm.

[Light Transmittance Characteristic of a Body Cured from Curable Organopolysiloxane Resin Composition]
The light transmittance characteristic of a cured body (optical path length: 1.0 mm) obtained by curing the curable organopolysiloxane resin composition for 1 hour at 150° C. in a hot-air-circulation-type oven was measured at 25° C. with a light having a wavelength in the range of 400 nm to 555 nm. Following this, in order to study coloration caused by an accelerated deterioration test, the light transmittance characteristic was measured at 25° C. in the same manner by using 400 nm to 555 nm light after aging for 14 days by heating the cured body in a hot-air-circulation-type oven at 200° C.

[Adhesive Strength of a Cured Body Made From a Curable Organopolysiloxane Resin Composition]
Spacers made from a fluororesin having a thickness of 2 mm and a 5 mm-diameter opening were placed onto various adhesion test panels, the curable organopolysiloxane resin composition was poured into the aforementioned spacer openings, and the units were retained for 1 hour in a hot-air-circulation-type oven at 150° C., whereby cylindrical test pieces having a height of 2 mm and a diameter of 5 mm bonded to various test panels were obtained by curing the curable organopolysiloxane resin composition. The aforementioned cylindrical cured bodies of the curable organopolysiloxane resin composition tightly bonded to various test panels were tested with regard to adhesion strength by conducting peeling under load at a speed of 50 mm/min. on a die-shear-strength tester.

[Evaluation of Surface Condition of Cured Bodies Obtained From the Curable Organopolysiloxane Resin Composition]
The surface condition was evaluated by checking the smoothness on the upper parts of the aforementioned 5 mm-diameter, 2 mm-high cylindrical adhesion strength test pieces comprising cured bodies of addition-reaction-curable silicone. The following criteria were used: smooth surface: ○; rough surface: X.

Synthesis Example 1

A four-neck flask equipped with a stirrer, reflux cooler, inlet port, and a thermometer was filled with 82.2 g of 1,3-divinyl-1,1,3,3-tetramethyldisiloxane, 143 g of water, 0.38 g of trifluoromethanesulfonic acid, and 500 g of toluene. The components were mixed, and while the components were stirred, 524.7 g of phenyltrimethoxysilane were added drop-wise during 1 hour. After adding phenyltrimethoxysilane, the product was subjected to 1 hour of reflux with heating. After cooling, the lower layer was separated, and the toluene solution layer was washed three times with water. Following this, 0.40 g of potassium hydroxide was added to the washed toluene solution layer, and the solution was subjected to reflux while water was removed through a water separation tube. After the separation of water was completed, the product was concentrated until the concentration of solids reached 75 wt. %, and reflux was carried out for 5 hours. After cooling, the product was neutralized by adding 0.6 g of acetic acid, and the obtained filtered toluene solution was washed three times with water. After the product was concentrated under reduced pressure, 420 g of a solid methylphenylvinylpolysiloxane resin (polyorganosiloxane resin A), represented by the average unit formula and the average structural formula given below, were obtained. The polystyrene-recalculated weight-average molecular weight of the obtained product was measured by gel permeation chromatography, showing a value of 2,300, and a total acid number equal to 0.001 mg/g was determined according to JIS K2501 (1992):

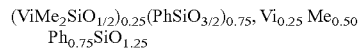

$(ViMe_2SiO_{1/2})_{0.25}(PhSiO_{3/2})_{0.75}, Vi_{0.25}Me_{0.50}Ph_{0.75}SiO_{1.25}$

Synthesis Example 2

A four-neck flask equipped with a stirrer, reflux cooler, inlet port, and a thermometer was filled with 100 g of toluene, 50 g of water, and 50 g of isopropyl alcohol. The components were mixed and, while the components were stirred, a liquid mixture of 14.11 g of methylvinyldichlorosilane, 19.37 g of dimethyldichlorosilane, and 158 g of phenyltrichlorosilane were added drop-wise during 1 hour. After adding was completed, the product was stirred for 1 hour at room temperature. The lower layer was separated, and the toluene solution layer was washed three times with water. Following this, 0.12 g of potassium hydroxide was added to the washed toluene solution layer, and the solution was subjected to reflux while water was removed through the water separation tube. After the separation of water was completed, the product was concentrated until the concentration of solids reached 70 wt. %, and reflux was carried out for 5 hours. After cooling, the product was neutralized by adding 0.2 g of acetic acid, and the obtained, filtered toluene solution was washed six times with water. After the product was concentrated under reduced pressure, 115 g of a solid methylphenylvinylpolysiloxane resin (polyorganosiloxane resin B), represented by the average unit formula and the average structural formula given below, were obtained. The polystyrene-recalculated weight-average molecular weight of the obtained product was measured by gel permeation chromatography showing a value of 7,200 and a total acid number equal to 0.002 mg/g was determined according to JIS K2501 (1992):

$(ViMeSiO_{2/2})_{0.10}(Me_2SiO_{2/2})_{0.15}(PhSiO_{3/2})_{0.75}, Vi_{0.10}Me_{0.40}Ph_{0.75}SiO_{1.375}$

Synthesis Example 3

A four-neck flask equipped with a stirrer, reflux cooler, inlet port, and a thermometer was filled with a mixture of 194.6 g of phenyltrimethoxysilane and 0.22 g of trifluoromethanesulfonic acid. The components were mixed and, while the components were stirred, 13.3 g of water were added drop-wise during 15 min. After adding was completed, the product was subjected to reflux with heat for 1 hour. After cooling to room temperature, 118.6 g of 1,1,3,3-tetramethyldisiloxane were added and, while the mixture was stirred, 88.4 g of acetic acid were added drop-wise during 30 min. After the addition was completed, the mixture was heated to 50° C. under stirring conditions, and a reaction was carried out for 3 hours. After cooling to room temperature, toluene and water were added, the mixture was well mixed, left at rest, and the water layer was separated. After the toluene solution layer was washed three times with water, the product was concentrated under reduced pressure, and 220 g of methylphenylhydrogenoligosiloxane (cross-linking agent A), represented by the siloxane unit formula and the average structural formula given below, were obtained. The obtained product had a viscosity of 25 mPa·s. The total acid number equal to 1.20 mg/g was determined according to JIS K2501 (1992):

$(HMe_2SiO_{1/2})_{0.60}(PhSiO_{3/2})_{0.40}, H_{0.60}Me_{1.20}Ph_{0.40}SiO_{0.90}$

Synthesis Example 4

220 g of methylphenylhydrogenoligosiloxane (cross-linking agent B), represented by the siloxane unit formula and the average structural formula given below, were obtained in the same manner as in Synthesis Example 3, except that the toluene solution layer was washed six times with water. The obtained product had a viscosity of 25 mPa·s. The total acid number equal to 0.06 mg/g was determined according to JIS K2501 (1992):

$(HMe_2SiO_{1/2})_{0.60}(PhSiO_{3/2})_{0.40}, H_{0.60}Me_{1.20}Ph_{0.40}SiO_{0.90}$

Synthesis Example 5

215 g of methylphenylhydrogenpolysiloxane (cross-linking agent C), represented by the siloxane unit formula and the average structural formula given below, were obtained in the same manner as in Synthesis Example 3, except that after the toluene solution layer was washed six times with water, the product was concentrated under reduced pressure, 1.0 g of activated carbon was added, and after stirring for 1 hour, the product was filtered. The obtained product had a viscosity of 25 mPa·s. The total acid number equal to 0.008 mg/g was determined according to JIS K2501 (1992):

$(HMe_2SiO_{1/2})_{0.60}(PhSiO_{3/2})_{0.40}, H_{0.60}Me_{1.20}Ph_{0.40}SiO_{0.90}$

Synthesis Example 6

A four-neck flask equipped with a stirrer, reflux cooler, inlet port, and a thermometer was filled with a mixture of 220 g of diphenyldimethoxysilane and 0.59 g of trifluoromethanesulfonic acid. The components were mixed, combined with 147 g of 1,1,3,3-tetramethyldisiloxane, and while the components were stirred, 108 g of acetic acid were added drop-wise during 30 min. After adding was completed, the liquid mixture was heated to 50° C. under stirring conditions, and a reaction was carried out for 3 hours. After cooling to room temperature, toluene and water were added, the mixture was well mixed, left at rest, and the water layer was separated. After the toluene solution layer was washed three times with water, the product was concentrated under reduced pressure, and 295 g of diphenylhydrogenpolysiloxane (cross-linking agent D) were obtained. The obtained product had a viscosity of 4 mPa·s. The total acid number equal to 1.700 mg/g was determined according to JIS K2501 (1992):

$(HMe_2SiO_{1/2})(Ph_2SiO_{2/2})(SiO_{1/2}Me_2H)$

Synthesis Example 7

295 g of the diphenylhydrogenpolysiloxane (cross-linking agent E), of the formula given below, were obtained in the same manner as in Synthesis Example 6, except that the toluene solution layer was washed six times with water. The obtained product had a viscosity of 4 mPa·s. The total acid number equal to 0.115 mg/g was determined according to JIS K2501 (1992):

$(HMe_2SiO_{1/2})(Ph_2SiO_{2/2})(SiO_{1/2}Me_2H)$

Synthesis Example 8

293 g of the diphenylhydrogenpolysiloxane (cross-linking agent F), of the formula given below, were obtained in the same manner as in Synthesis Example 6, except that after the toluene solution layer was washed six times with water and 1.5 g of active carbon were added under stirring conditions, the product was filtered and condensed under reduced pressure. The obtained product had a viscosity of 4 mPa·s. The total acid number equal to 0.020 mg/g was determined according to JIS K2501 (1992):

$(HMe_2SiO_{1/2})(Ph_2SiO_{2/2})(SiO_{1/2}Me_2H)$

Synthesis Example 9

A four-neck flask equipped with a stirrer, reflux cooler, inlet port, and a thermometer was filled with a mixture of 82.2 g of 1,3-divinyl-1,1,3,3-tetramethyldisiloxane and 143 g of water, 0.38 g of trifluoromethanesulfonic acid and 500 g of toluene. The components were mixed, and while the components were stirred, 524.7 g of phenyltrimethoxysilane were added drop-wise during 1 hour. After adding was completed, the product was subjected to reflux with heating for 1 hour. After cooling, the lower layer was separated and the toluene solution layer was washed three times with water. The washed toluene solution layer was combined with 314 g of methylglicydoxypropyldimethoxysilane, 130 g of water, and 0.50 g of potassium hydroxide. The mixture was subjected to reflux with heating for 1 hour. Following this, methanol was removed, and the excess water was removed by azeotropic dehydration. The product was subjected to four-hour reflux with heating. After completion of the reaction, the toluene solution was cooled, neutralized with 0.55 g of acetic acid, and washed three times with water. After the water was removed, 664 g of the liquid methylphenylvinylepoxypolysiloxane resin (additive A), represented by the average unit formula and average structural formula given below, were obtained. Polystyrene-referenced weight-average molecular weight was measured by gel-permeation chromatography and was equal to 2,100. The total acid number equal to 0.002 mg/g was determined according to JIS K2501 (1992). The obtained product had a viscosity of 8,500 mPa·s.

$$(ViMe_2SiO_{1/2})_{25}(Ph_2SiO_{3/2})_{75}(EpMeSiO_{2/2})_{40}$$

$$[Vi_{0.18}Me_{0.64}Ep_{0.29}Ph_{0.54}SiO_{1.18}]$$

wherein Ep designates a glicydoxypropyl group.

Synthesis Example 10

A four-neck flask equipped with a stirrer, reflux cooler, inlet port, and a thermometer was filled with a mixture of 82.2 g of 1,3-divinyl-1,1,3,3-tetramethyldisiloxane and 143 g of water, 0.38 g of trifluoromethanesulfonic acid and 500 g of toluene. The components were mixed, and while the components were stirred, 524.7 g of phenyltrimethoxysilane were added drop-wise during 1 hour. After adding was completed, the product was subjected to reflux with heating for 1 hour. After cooling, the lower layer was separated, and the toluene solution layer was washed three times with water. The washed toluene solution layer was combined with 336 g of glicydoxypropyltrimethoxysilane, 6 g of water, and 0.50 g of potassium hydroxide. Following this, methanol was removed, and reflux with heating was continued for 4 hours. After completion of the reaction, the toluene solution was cooled, neutralized with 0.55 g of acetic acid, and washed three times with water. After the water was removed and the toluene was distilled and condensed under reduced pressure, 670 g of a liquid methylphenylvinylepoxypolysiloxane resin (additive B), represented by the average unit formula and average structural formula given below, were obtained. Polystyrene-referenced weight-average molecular weight was measured by gel-permeation chromatography and was equal to 1,700. The total acid number equal to 0.005 mg/g was determined according to JIS K2501 (1992). The obtained product had a viscosity of 700 mPa·s.

$$(ViMe_2SiO_{1/2})_{25}(Ph_2SiO_{3/2})_{75}(EpSiO_{3/2})_{40}(OMe)_{50}$$

$$[Vi_{0.18}Me_{0.36}Ep_{0.29}Ph_{0.54}SiO_{1.32}(OMe)_{0.36}]$$

wherein Ep designates a glicydoxypropyl group.

[Other Compounds Used in the Composition]

Cross-linking Agent G
Copolymer of methylethylsiloxane and methylhydrogensiloxane of the formula is given below:

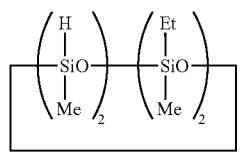

where Me represents a methyl group, and Et represents an ethyl group. The total acid number, according to JIS K2501 (1992), is 0.004 mg/g. Cross-linking agent G is obtained by causing an addition reaction between a gaseous ethylene and a cyclic organooligosiloxane having a silicon-bonded hydrogen atom and represented by the following formula, the reaction being carried out in the presence of a platinum catalyst:

$$(HMeSiO_{2/2})_4$$

and then by subjecting the obtained product to distillation for purification.

Retarding Agent
Cyclotetramethyltetravinyltetrasiloxane

Platinum Catalyst
Complex of platinum with 1,3-divinyl-1,1,3,3-tetramethyldisiloxane (the content of metallic platinum is 4 wt. %).

Diluent A
Diphenylbis (dimethylvinylsiloxy) silane

Diluent B
Phenyltris (dimethylvinylsiloxy) silane

Additive C
Product of condensation reaction between a glicydoxypropyltrimethoxysilane and a copolymer of methylvinylsiloxane and dimethylsiloxane capped at molecular terminals with silanol groups of the following formula.

$$CH_3O(CH_3O(Ep)SiO_{0.5})_x(MeViSiO_{0.5})_x(Me_2SiO_{0.5})_x OCH_3.$$

In the above formula, Ep represents a glicydoxypropyl group, and subscript "x" is correlated with viscosity of the product of the condensation reaction, which was 30 mPa·s.

Application Example 1

Cross-linking agent B obtained in Synthesis Example 3 was added to polyorganosiloxane resin A obtained in Synthesis Example 1, and the components were uniformly mixed to form a viscous liquid. The obtained liquid was further combined with the aforementioned retardant and platinum catalyst, and the components were mixed to produce a curable organopolysiloxane resin composition. The obtained curable silicone composition was tested with regard to viscosity, total acid number, index of refraction, and light transmittance. The composition was cured at 150° C. for 15 min. under a pressure of 10 MPa. Hardness and light transmittance of the obtained cured body was measured. Light transmittance characteristics of the obtained molded product were measured for the second time after heating the molded product for 28 days at 200° C. Furthermore, for evaluating adhesion of the obtained composition to a silver-plated steel plate, PPA (polyphthalamide resin) panel, and BT resin (bismaleimide-triazine resin) panel, the products molded from the composition were subjected to a die-shear test. The surface of the molded product was visually observed. The compositions used are shown in Table 1, and the results are shown in Table 5.

Application Examples 2 to 14

Similar to Application Example 1, the resins, cross-linking agents, retardants, platinum catalysts, and other additives shown in Tables 1 to 3 were compounded for preparing appropriate organopolysiloxane resin compositions. Characteristics of the same type as in Application Example 1 were evaluated. The results of the evaluation are shown in Tables 5 to 7.

Comparative Examples 1 and 2

Similar to Application Example 1, the resins, cross-linking agents, retardants, and platinum catalysts shown in Table 4 were compounded for preparing appropriate organopolysiloxane resin compositions. Characteristics of the same type as in Application Example 1 were evaluated. The results of the evaluation are shown in Table 8.

TABLE 1

| | Application Examples | | | | |
|---|---|---|---|---|---|
| | 1 | 2 | 3 | 4 | 5 |
| Polyorganosiloxane Resin A | 72 | 72 | 74 | 74 | 74.5 |
| Cross-linking Agent B | 27 | | | | |
| Cross-linking Agent C | | 27 | | | |
| Cross-linking Agent E | | | 25 | | |
| Cross-linking Agent F | | | | 25 | |
| Cross-linking Agent G | | | | | 24.5 |
| Retardant | 1 | 1 | 1 | 1 | 1 |
| Platinum Catalyst | 0.0125 | 0.0125 | 0.0125 | 0.0125 | 0.0125 |

TABLE 2

| | Application Examples | | | | |
|---|---|---|---|---|---|
| | 6 | 7 | 8 | 9 | 10 |
| Polyorganosiloxane Resin A | | 72 | 74 | 74.5 | 70 |
| Polyorganosiloxane Resin B | 46 | | | | |
| Cross-linking Agent C | 25 | 27 | | | 3 |
| Cross-linking Agent D | | | 25 | | 24 |
| Cross-linking Agent G | | | | 24.5 | |
| Diluent A | 6 | | | | 1 |
| Diluent B | 12 | | | | 1 |
| Retardant A | | 1 | 1 | 1 | 1 |
| Retardant B | 0.005 | | | | |
| Platinum Catalyst | 0.0125 | 0.0125 | 0.0125 | 0.0125 | 0.0125 |
| Additive C | | 1 | 1 | 1 | 1 |

TABLE 3

| | Application Examples | | | |
|---|---|---|---|---|
| | 11 | 12 | 13 | 14 |
| Polyorganosiloxane Resin A | 70 | 70 | 70 | 70 |
| Cross-linking Agent C | 3 | 3 | 3 | 3 |
| Cross-linking Agent D | 24 | 24 | 24 | 24 |
| Diluent A | 1 | 1 | 1 | 1 |
| Diluent B | 1 | 1 | 1 | 1 |
| Retardant A | 1 | 1 | 1 | 1 |
| Platinum Catalyst | 0.0125 | 0.0125 | 0.0125 | 0.0125 |
| Additive A | 1 | 2 | | |
| Additive B | | | 1 | 2 |

TABLE 4

| | Comparative Example 1 | Comparative Example 2 |
|---|---|---|
| Polyorganosiloxane Resin A | 72 | 74 |
| Cross-linking Agent A | 27 | |
| Cross-linking Agent D | | 25 |
| Retardant | 1 | 1 |
| Platinum Catalyst | 0.0125 | 0.0125 |

TABLE 5

| | Application Examples | | | | |
|---|---|---|---|---|---|
| | 1 | 2 | 3 | 4 | 5 |
| Total Acid Number (mg/g) | 0.016 | 0.003 | 0.031 | 0.006 | 0.003 |
| Viscosity (mPa·s) | 8,100 | 7,900 | 3,200 | 3,200 | 3,300 |
| Refractive Index | 1.524 | 1.524 | 1.533 | 1.533 | 1.502 |
| Light Transmittance (555 nm) | | | | | |
| initial (%) | 99 | 99 | 99 | 99 | 99 |
| after aging (%) | 95 | 97 | 95 | 97 | 98 |
| Light Transmittance (400 nm) | | | | | |
| initial (%) | 99 | 99 | 99 | 99 | 99 |
| after aging (%) | 48 | 58 | 45 | 56 | 62 |
| Hardness (Type D) | 72 | 72 | 61 | 61 | 65 |
| Adhesion | | | | | |
| PPA (kgf) | 2 | 2 | 7 | 7 | 8 |
| BT (kgf) | 3 | 3 | 8 | 8 | 9 |
| Silver-plated Steel Plate (kgf) | 2 | 2 | 6 | 6 | 7 |
| Surface Condition of Molded Product | ◯ | ◯ | ◯ | ◯ | X |

TABLE 6

| | Application Examples | | | | |
|---|---|---|---|---|---|
| | 6 | 7 | 8 | 9 | 10 |
| Total Acid Number (mg/g) | 0.004 | 0.003 | 0.006 | 0.003 | 0.005 |
| Viscosity (mPa.s) | 12,000 | 6,400 | 2,500 | 2,600 | 2,000 |
| Refractive Index | 1.515 | 1.524 | 1.533 | 1.502 | 1.531 |

TABLE 6-continued

|  | Application Examples | | | | |
| --- | --- | --- | --- | --- | --- |
|  | 6 | 7 | 8 | 9 | 10 |
| Light Transmittance (555 nm) | | | | | |
| initial (%) | 99 | 99 | 99 | 99 | 99 |
| after aging (%) | 98 | 96 | 96 | 97 | 96 |
| Light Transmittance (400 nm) | | | | | |
| initial (%) | 99 | 99 | 99 | 99 | 99 |
| after aging (%) | 61 | 52 | 51 | 58 | 54 |
| Hardness (Type D) | 68 | 72 | 61 | 65 | 66 |
| Adhesion | | | | | |
| PPA (kgf) | 2 | 7 | 10 | 13 | 12 |
| BT (kgf) | 3 | 10 | 13 | 16 | 15 |
| Silver-plated Steel Plate (kgf) | 2 | 6 | 9 | 11 | 11 |
| Surface Condition of Molded Product | ○ | ○ | ○ | X | ○ |

TABLE 7

|  | Application Examples | | | |
| --- | --- | --- | --- | --- |
|  | 11 | 12 | 13 | 14 |
| Total Acid Number (mg/g) | 0.005 | 0.005 | 0.005 | 0.005 |
| Viscosity (mPa·s) | 2,600 | 2,300 | 2,100 | 1,800 |
| Refractive Index | 1.531 | 1.531 | 1.531 | 1.531 |
| Light Transmittance (555 nm) | | | | |
| initial (%) | 99 | 99 | 99 | 99 |
| after aging (%) | 97 | 96 | 96 | 96 |
| Light Transmittance (400 nm) | | | | |
| initial (%) | 99 | 99 | 99 | 99 |
| after aging (%) | 54 | 53 | 52 | 51 |
| Hardness (Type D) | 66 | 65 | 66 | 65 |
| Adhesion | | | | |
| PPA (kgf) | 15 | 16 | 14 | 16 |
| BT (kgf) | 18 | 18 | 19 | 19 |
| Silver-plated Steel Plate (kgf) | 14 | 15 | 15 | 17 |
| Surface Condition of Molded Product | ○ | ○ | ○ | ○ |

TABLE 8

|  | Comp. Ex. 1 | Comp. Ex. 2 |
| --- | --- | --- |
| Total Acid Number (mg/g) | 0.320 | 0.460 |
| Viscosity (mPa·s) | 80,000 | 3,200 |
| Refractive Index | 1.524 | 1.533 |
| Light Transmittance (555 nm) | | |
| initial (%) | 99 | 99 |
| after aging (%) | 89 | 87 |
| Light Transmittance (400 nm) | | |
| initial (%) | 99 | 99 |
| after aging (%) | 27 | 22 |
| Hardness (Type D) | 72 | 61 |

INDUSTRIAL APPLICABILITY

Since cured bodies obtained from the curable silicone composition of the invention are transparent and are not subject to a noticeable decrease in light transmittance characteristics, even when exposed to high temperatures, this composition is suitable for manufacturing optical parts, i.e., those operating at temperatures higher than room temperature, e.g., at temperatures in the range of 50 to 200° C., such as parts installed directly on or in the vicinity of high-intensity light sources. Furthermore, since the composition can be easily prepared with desired adhesive properties, the composition is suitable for use as a sealant, adhesive substance, potting agent, protective coating agent, underfiller, or a similar material for use in conjunction with optical semiconductor elements and light-guiding parts. The optical parts of the invention are not subject to a decrease in light-transmittance characteristics when exposed to high temperatures, and because of an insignificant decrease of light-transmittance characteristics under the effect of high temperatures that may occur during production, the aforementioned parts are characterized by long-term reliability and are suitable especially for use in light-emitting elements of high-intensity or in similar optical semiconductor devices, as well as for parts that operate in the vicinity of high-intensity light sources.

The invention claimed is:

1. A curable organopolysiloxane resin composition having a viscosity at 25° C. in the range of 0.001 to 5,000 Pa·s, a total acid number as specified by JIS K 2501 (1992) in the range of 0.0001 to 0.2 mg/g, light transmittance in a cured state equal to or greater than 80% measured at 555 nanometers through a 1 mm thick sample of said cured organopolysiloxane resin composition and light transmittance in the cured state of at least 40% measured at 400 nanometers through a 1 mm thick sample of said cured organopolysiloxane resin composition after said cured organopolysiloxane resin composition is aged at 200° C. for 14 days.

2. The curable organopolysiloxane resin composition of claim 1, comprising:

(A) 100 parts by weight of an organopolysiloxane resin that contains at least an alkenyl group and a phenyl group and is represented by the following average structural formula:

$$R^1_a R^2_b SiO_{(4-a-b)/2} \qquad (1)$$

(where $R^1$ is an alkenyl group having 2 to 10 carbon atoms, $R^2$ is an optionally substituted univalent hydrocarbon group (except for an alkenyl group) having 1 to 10 carbon atoms, at least 20 mole % of $R^2$ comprising phenyl groups; subscript "a" is a number in the range of 0.05 to 0.5, and subscript "b" is a number in the range of 0.80 to 1.80);

(B) 10 to 100 parts by weight of an organohydrogenpolysiloxane having in one molecule at least two silicon-bonded hydrogen atoms and represented by the following average structural formula:

$$H_c R^3_d SiO_{(4-c-d)/2} \quad (2)$$

(where $R^3$ is an optionally substituted univalent hydrocarbon group (except for an alkenyl group) having 1 to 10 carbon atoms; subscript "c" is a number in the range of 0.35 to 1.0, and subscript "d" is a number in the range of 0.90 to 2.0); and (C) a catalytic quantity of a hydrosilylation-reaction catalyst.

3. The curable organopolysiloxane resin composition according to claim 2, wherein component (B) comprises (B1) an organohydrogenpolysiloxane having in one molecule at least two silicon-bonded hydrogen atoms or a mixture of constituent (B1) with (B2) an organohydrogenpolysiloxane having in one molecule three or more silicon-bonded hydrogen atoms.

4. The curable organopolysiloxane resin composition according to claim 2, further comprising (D) 2 to 50 parts by weight of an organooligosiloxane having at least an alkenyl group and a phenyl group and represented by the following average structural formula:

$$R^6_e R^7_f SiO_{(4-e-f)/2} \quad (3)$$

(where $R^6$ is an alkenyl group having 2 to 10 carbon atoms, $R^7$ is an optionally substituted univalent hydrocarbon having 1 to 10 carbon atoms (except for an alkenyl group); at least 10 mole % of $R^7$ being phenyl groups; subscript "e" is a number in the range of 0.40 to 0.80; and subscript "f" is a number in the range of 1.50 to 2.10).

5. The curable organopolysiloxane resin composition according to claim 2, further comprising (E) 0.01 to 20 parts by weight of an epoxy-containing organic silicon compound.

6. The curable organopolysiloxane resin composition according to claim 5, wherein epoxy-containing organic silicon compound (E) is a compound represented by the following average structural formula:

$$R^8_h R^9_i SiO_{(4-h-i)/2} \quad (4)$$

(where $R^8$ is an epoxy-containing organic group, $R^9$ is an optionally substituted univalent hydrocarbon group that may not have an epoxy group and that contains 1 to 10 carbon atoms; 1 mole % or more of all substituents of component E comprising alkenyl groups; subscript "h" is a number in the range of 0.05 to 1.8; and subscript "i" is a number in the range of 0.10 to 1.80).

7. The curable organopolysiloxane resin composition according to claim 6, wherein the average structural formula (4) subscript "h" is a number in the range of 0.10 to 1.80 and (h+i)≧2; 3 mole % or more of the total number of substituents of component E being alkenyl groups, and 3 mole % or more of the total number of substituents of component E being phenyl groups.

8. An optical part made from a cured body of a curable organopolysiloxane resin composition according to claim 1.

9. An optical part made from a cured body of a curable organopolysiloxane resin composition according to claim 1 comprising an optical semiconductor device as an optical semiconductor element coated by a cured body of the curable organopolysiloxane resin composition according to claim 1.

10. The curable organopolysiloxane resin composition according to claim 3, further comprising (D) 2 to 50 parts by weight of an organooligosiloxane having at least an alkenyl group and a phenyl group and represented by the following average structural formula:

$$R^6_e R^7_f SiO_{(4-e-f)/2} \quad (3)$$

(where $R^6$ is an alkenyl group having 2 to 10 carbon atoms, $R^7$ is an optionally substituted univalent hydrocarbon having 1 to 10 carbon atoms (except for an alkenyl group); at least 10 mole % of $R^7$ being phenyl groups; subscript "e" is a number in the range of 0.40 to 0.80; and subscript "f" is a number in the range of 1.50 to 2.10).

11. The curable organopolysiloxane resin composition according to claim 3, further comprising (E) 0.01 to 20 parts by weight of an epoxy-containing organic silicon compound.

12. The curable organopolysiloxane resin composition according to claim 11, wherein epoxy-containing organic silicon compound (E) is a compound represented by the following average structural formula:

$$R^8_h R^9_i SiO_{(4-h-i)/2} \quad (4)$$

(where $R^8$ is an epoxy-containing organic group, $R^9$ is an optionally substituted univalent hydrocarbon group that may not have an epoxy group and that contains 1 to 10 carbon atoms; 1 mole % or more of all substituents of component E comprising alkenyl groups; subscript "h" is a number in the range of 0.05 to 1.8; and subscript "i" is a number in the range of 0.10 to 1.80).

13. The curable organopolysiloxane resin composition according to claim 12, wherein the average structural formula (4) subscript "h" is a number in the range of 0.10 to 1.80 and (h+i)≧2; 3 mole % or more of the total number of substituents of component E being alkenyl groups, and 3 mole % or more of the total number of substituents of component E being phenyl groups.

14. The curable organopolysiloxane resin composition according to claim 4, further comprising (E) 0.01 to 20 parts by weight of an epoxy-containing organic silicon compound.

15. The curable organopolysiloxane resin composition according to claim 14, wherein epoxy-containing organic silicon compound (E) is a compound represented by the following average structural formula:

$$R^8_h R^9_i SiO_{(4-h-i)/2} \quad (4)$$

(where $R^8$ is an epoxy-containing organic group, $R^9$ is an optionally substituted univalent hydrocarbon group that may not have an epoxy group and that contains 1 to 10 carbon atoms; 1 mole % or more of all substituents of component E comprising alkenyl groups; subscript "h" is a number in the range of 0.05 to 1.8; and subscript "i" is a number in the range of 0.10 to 1.80).

16. The curable organopolysiloxane resin composition according to claim 15, wherein the average structural formula (4) subscript "h" is a number in the range of 0.10 to 1.80 and (h+i)≧2; 3 mole % or more of the total number of substituents of component E being alkenyl groups, and 3 mole % or more of the total number of substituents of component E being phenyl groups.

* * * * *